United States Patent [19]

Shaver

[11] 3,976,952

[45] Aug. 24, 1976

[54] SENSE AMPLIFIER

[75] Inventor: David M. Shaver, Brockville, Canada

[73] Assignee: GTE Automatic Electric (Canada) Limited, Brockville, Canada

[22] Filed: Aug. 16, 1974

[21] Appl. No.: 498,157

[52] U.S. Cl. ............................ 330/30 D; 307/235 F; 330/17; 330/207 P
[51] Int. Cl.² .......................................... H03F 3/45
[58] Field of Search .......... 307/235, 236; 330/30 D, 330/69, 207 P

[56] References Cited
UNITED STATES PATENTS

| | | |
|---|---|---|
| 3,185,934 | 5/1965 | Patmore et al. .................. 330/207 P |
| 3,413,492 | 11/1968 | Schneider ....................... 307/236 X |
| 3,471,794 | 10/1969 | Gugliotti ............................. 330/23 |
| 3,562,554 | 2/1971 | Von Feldt....................... 307/236 X |

*Primary Examiner*—R. V. Rolinec
*Assistant Examiner*—Lawrence J. Dahl

[57] ABSTRACT

A sense amplifier having three transistor stages. A balanced differential input stage with high noise immunity to capacitively coupled noise. A second threshold stage is provided with protection against an output being caused by a permanent potential on the input, false trigger protection circuitry, and protection against supply voltage and other minor variations. A differential output stage increases noise immunity of the amplifier output and protects against a short circuit in the output.

4 Claims, 4 Drawing Figures

SENSE AMPLIFIER

CROSS REFERENCES TO RELATED APPLICATIONS

The invention is incorporated in the Ring Core Memory Arrangement application by Lighthall and Shaver, Ser. No. 498,145, filed the same day as this application.

The invention is also disclosed in the Fault Detection for a Ring Core Memory by Lighthall, Ser. No. 498,158, filed the same day as this application.

BACKGROUND OF THE INVENTION

1. Field of the Invention

The invention relates to the detection and amplification of the outputs from the sense windings of a memory arrangement, and more particularly to detecting the output from the sense windings of a plurality of ring core modules each of which has a plurality of word wires.

2. Description of the Prior Art

The invention was developed for the system shown in U.S. Pat. No. 3,767,863 issued Oct. 23, 1973 by Borbas et al for a Communication Switching System with Modular Organization and Bus, hereinafter referred to as the System S2 patent.

A ring core memory arrangement is described in U.S. Pat. No. 3,487,173 issued Dec. 30, 1969 by Duthie et al for a Small Exchange Stored Program Switching System, hereinafter referred to as the System S1 patent. The memory and sense amplifier of the system is shown in U.S. Pat. No. 3,587,070 issued June 22, 1971 by Thomas for a Memory Arrangement having both Magnetic-Core and Switching-Device Storage with a Common Address Register, hereinafter referred to as the S1 Memory patent.

The sense amplifier (designated a read amplifier) in the S1 Memory patent had individual inputs for each sense winding output of the core and this allowed a high noise level. The input and output are both single sided and there are five summing inputs, one for each core. This produced a noise prone configuration since five inputs are summed at the amplifier and each has up to fifteen feet of wire on it and also one wire of each pair from the core output is AC coupled to ground and is thus not balanced. Another problem with the S1 sense amplifier was that if one core was shorted to ground both outputs would be reduced, thereby affecting both systems. Further, the output circuit of the amplifier was not protected from damage by shorts to ground or from the voltage supply.

SUMMARY OF THE INVENTION

According to the invention, a three stage sense amplifier is provided with a differential balanced input to a dual transistor first stage provided with a separate current source where the dual inputs are transformed into a single output, which is coupled through a capacitor to the second stage. This capacitor provides an AC input to the second stage which protects against a permanent output if a permanent potential is input on one of the two input lines to the first stage. The signal at the second stage is coupled to a transistor which is provided with a zener diode and a second diode across its base and collector to compensate for any supply voltage variations. This transistor amplifies the signal it receives and applies it to a second transistor in the stage which is set to conduct at a specific voltage setting. When this voltage is reached this transistor conducts and sends a signal to the base of a transistor in the third stage. This transistor in the third stage is a phase splitter which has two outputs. The two outputs are coupled to a second and third transistor of this stage, respectively, which are also balanced giving a differential output. The emitter circuits of the second and third transistors of the third stage are provided with resistors to prevent damage to the circuit by shorts to ground or in the voltage supply in the output circuit.

A first object of the invention is to provide a balanced input to provide high noise immunity to the amplifier to capacitively coupled noise.

A second object of the invention is to provide a differential output to increase the noise immunity of the circuits receiving the amplified signal from the sense amplifier.

A third object is to provide a fully short circuit proof output for the sense amplifier.

A fourth object is to provide a low power circuit to achieve the packing densities required to put the maximum number of amplifier circuits on one circuit card.

A fifth object of the invention is to provide protection against a permanent potential on the input causing a permanent output from the sense amplifier.

A final object of the system is to provide a differential input which will protect one of the inputs from a short in the other input circuitry.

BRIEF DESCRIPTION OF THE DRAWINGS

The above mentioned and other features and objects of this invention and the manner of obtaining them will become more apparent, and the invention itself will be best understood by reference to the following description of an embodiment of the invention taken in conjunction with the accompanying drawings, in which.

DESCRIPTION OF THE PREFERRED EMBODIMENT

Figure 1:
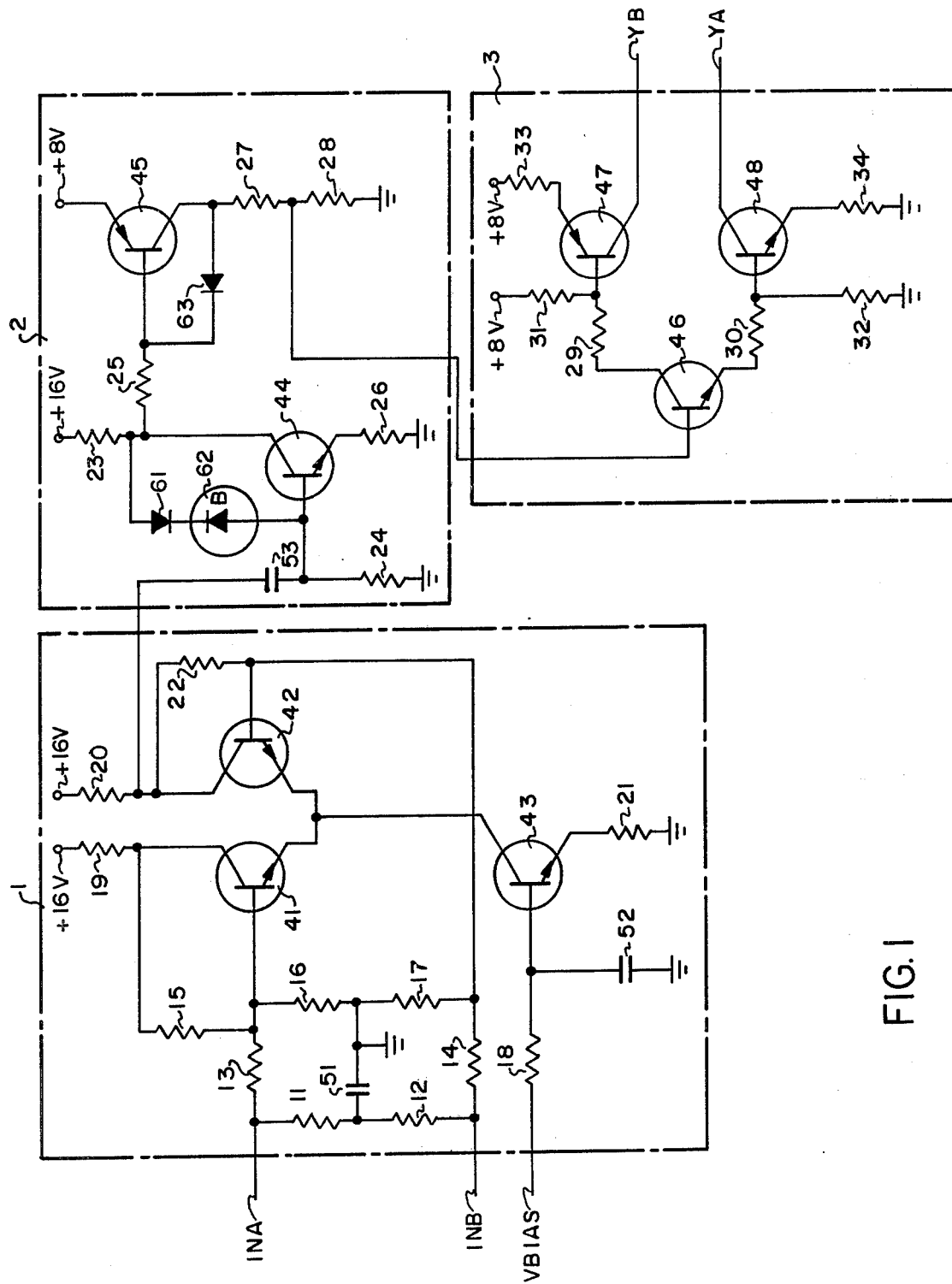
FIG. 1 is a schematic diagram of the improved sense amplifier.

FIG. 1 shows the improved sense amplifier of the invention comprised of three blocks-balanced differential input 1, threshold circuit 2, and differential output stage 3.

Input stage 1 has two balanced inputs designated INA and INB. The input impedance for INA and INB is effectively resistors 11 and 12 in parallel with resistors 13 and 14 to provide a damping impedance for the circuit input signals INA and INB. The input resistors 11 and 12 and capacitor 51 provide AC impedance for each input to ground, while DC impedance to ground is via resistors 13 and 16 for INA and resistors 14 and 17 for INB.

A current source for transistors 41 and 42 is provided by VBIAS, resistors 18 and 21, capacitor 52, and transistor 43. The VBIAS is applied to the base of transistor 43 to provide a current source for transistors 41 and 42. The current source is set by the selection of resistor 21. Biasing resistors 15, 16, 17, and 22 insure that each of the transistors 41 and 42 operate at the proper level.

The gain of stage 1 is determined by resistors 13, 15, 19, 20, 22 and 14 and is typically set to be two. The dual balanced inputs to the stage produce a single output from the collector of transistor 42.

The output from transistor 42 is coupled through capacitor 53 to the base of the first transistor 44 in threshold stage 2. Capacitor 53 provides an AC connection to the threshold circuit to prevent permanent potentials on input INA or INB from causing a permanent output from the sense amplifier. Diode 61 and zener diode 62 are coupled across the base to collector of transistor 44 to set the quiescent operating point for transistor 44 to compensate for supply voltage variations and other minor variations. In the quiescent state, diode 61 and zener diode 62 insure that the voltage at the collector of transistor 44 is at a specified value between 8 and 16 volts. The gain of this stage is set by the ratio of resistor 23 divided by resistor 26. The further amplified signal is coupled from transistor 44 through resistor 25 to the base of transistor 45. Transistor 45 is set to operate at a particular voltage by referencing its emitter to the +8 volt supply. When this voltage is supplied by transistor 44 transistor 45 will operate and couple the signal through resistor 27 to the base of the first transistor 46 in output stage 3 of the sense amplifier.

Transistor 46 is a phase splitter which causes both transistors 47 and 48 to conduct when a positive voltage is applied to the base of transistor 46 by transistor 45. Transistors 47 and 48 provide a differential output for the circuit which provides for high noise immunity in the output. The resistors 33 and 34 are provided in the emitter circuits of transistors 47 and 48, respectively, to prevent short circuit damage to the circuit.

The operation of the invention may be now fully understood by an explanation of the signal path through the entire circuit. The input is defined such that the signal polarity of INA will go positive with respect to INB (as from the sense winding of a memory core). This will cause transistor 41 to conduct more and transistor 42 to conduct less. The voltage at the collector of transistor 42 is driven more positive and is coupled by capacitor 53 to the base of transistor 44. The positive going signal coupled to the base of transistor 44 causes its collector voltage to go toward ground. Transistor 45 is a PNP device with its emitter connected to the +8 volt supply preventing it from conducting until its base is driven more negative than the +8 volt supply. Therefore an output from the collector of transistor 44 will not cause transistor 45 to conduct while it varies between 8 and 16 volts. However, as soon as the positive signal coupled to the base of transistor 44 causes the collector to go more negative that the +8volt supply, transistor 45 conducts.

The signal is now considered legitimate. Transistor 45 and associated circuitry prevent false triggering by rejecting any signals below the referenced value. When transistor 45 conducts, the voltage at the junction of resistors 27 and 28 is caused to go positive. This is coupled to the phase splitter transistor 46 causing it to conduct. The voltage at the emitter of transistor 46 now goes positive causing transistor 48 to conduct via resistor 30, and at the same time the collector of transistor 46 goes negative from the +8 volt supply causing transistor 47 to conduct via resistor 29. Transistor 48 brings the output YA from +8 volts toward ground when it conducts, while transistor 47 brings the output YB from ground toward +8 volts when it conducts. Thus, it can be clearly seen that a differential signal on the input which causes INA to go more positive than INB, has produced a differential output causing YB to go more positive than YA.

Figure 2:
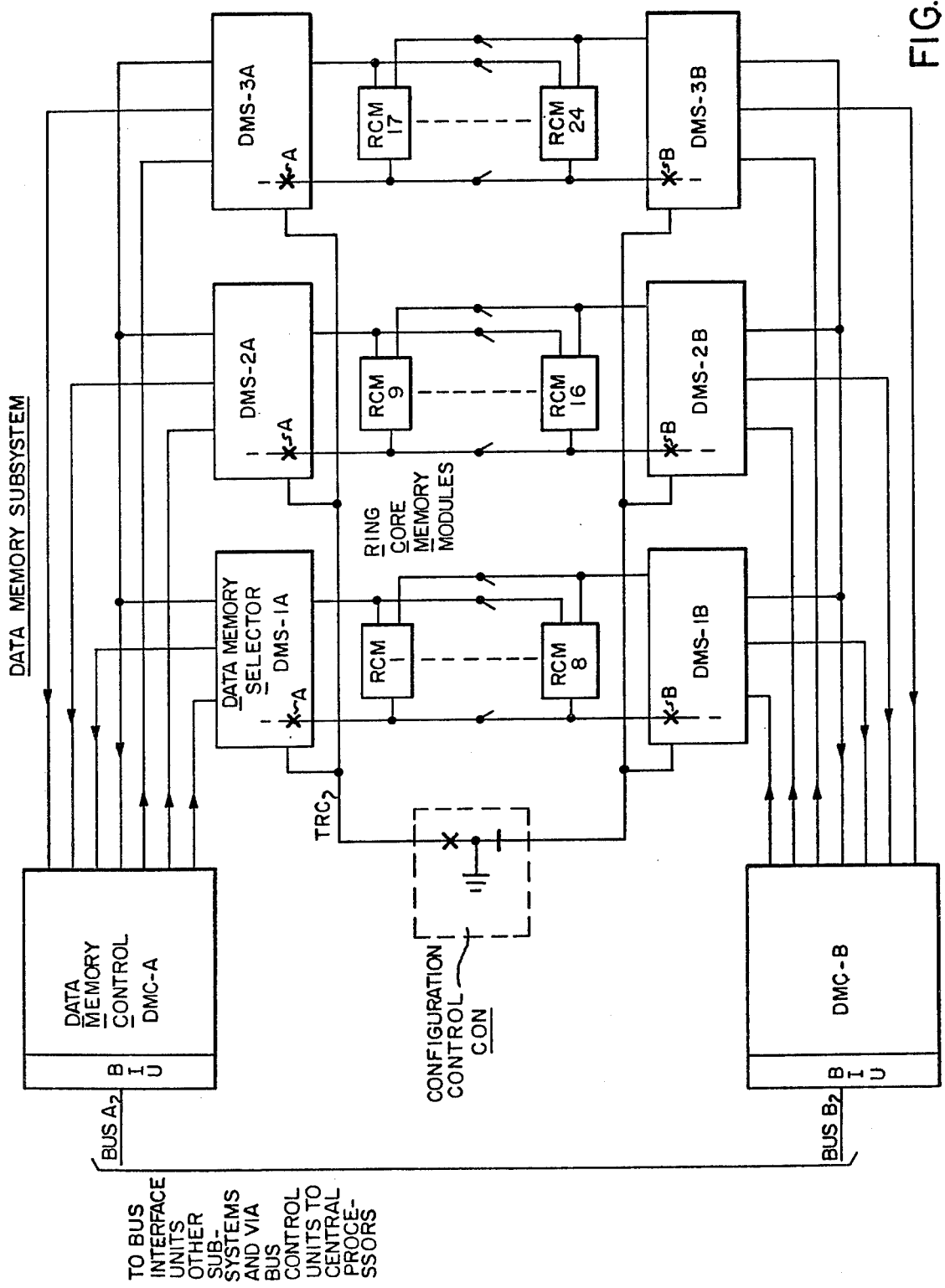
FIG. 2 is a block diagram of a particular data memory subsystem which incorporates sense amplifiers.
Figure 3:
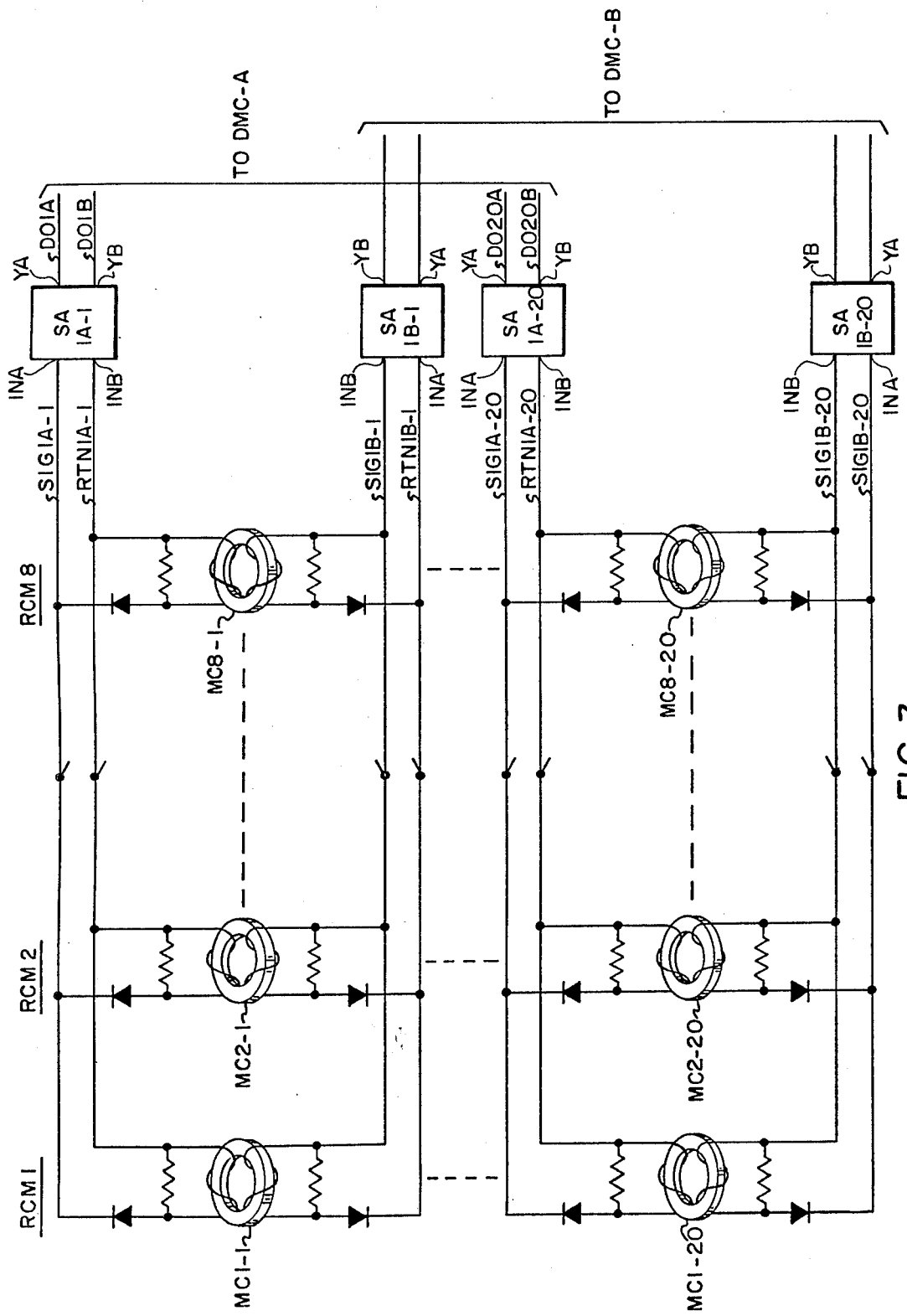
FIG. 3 is a diagram showing the input to sense amplifiers from the sense windings of the particular data memory subsystem.
Figure 4:
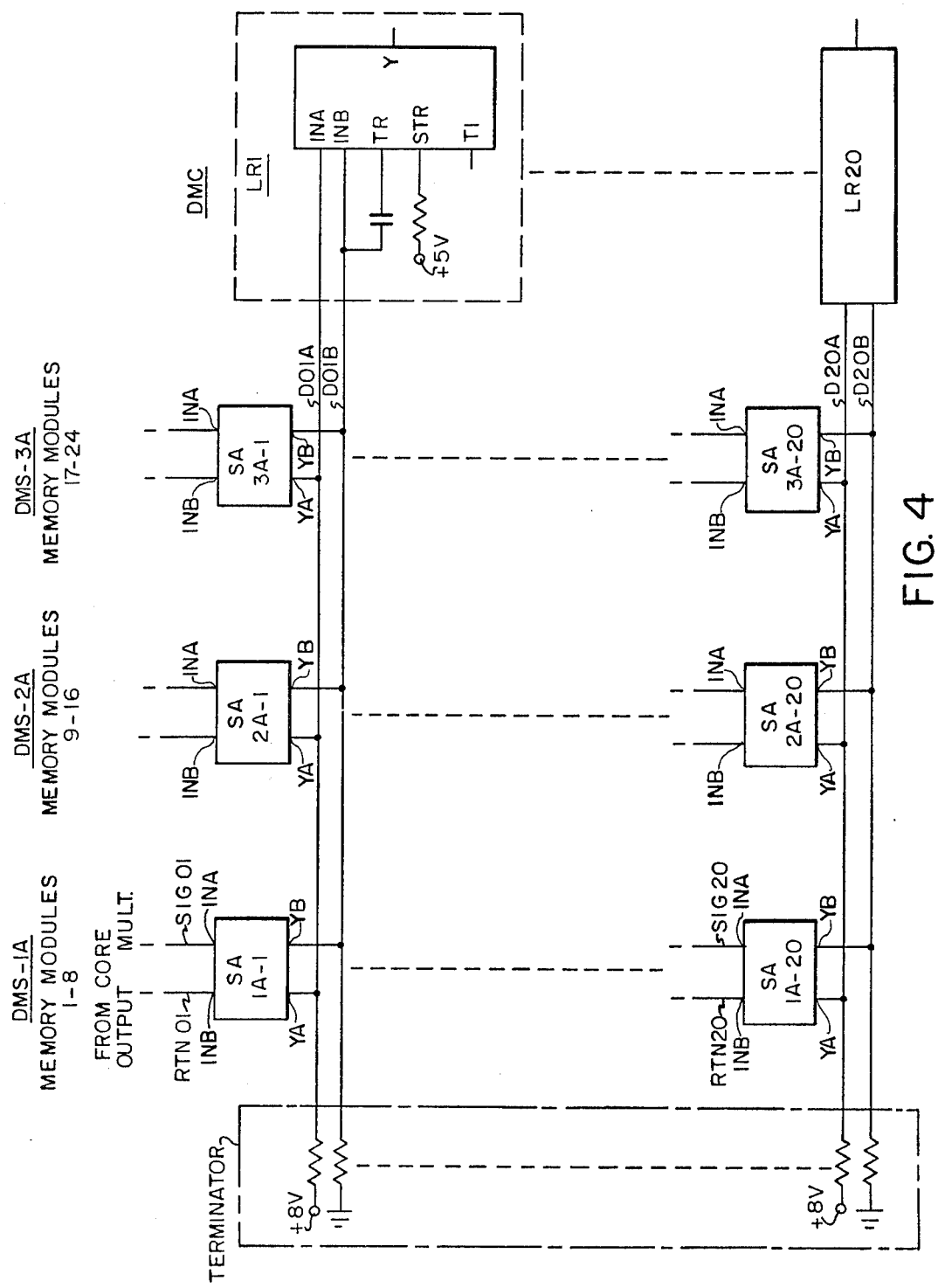
FIG. 4 shows how the outputs of sense amplifiers are coupled to line receivers in the particular data memory subsystem.

Referring to FIGS. 2, 3, and 4 a particular environment is disclosed for the improved sense amplifier. FIG. 2 in particular shows the main blocks of a particular data memory subsystem, data memory control (DMC), data memory selector (DMS), and ring core memory (RCM). Further particular details of the data memory subsystem are shown in the co-pending above mentioned application to Lighthall and Shaver.

Of particular interest to the present invention is FIG. 3. In FIG. 3 the outputs from the ring cores are shown as inputs to sense amplifiers. In contrast to the previous S1 Memory patent which had all core outputs run individually to the sense amplifiers, in this System S2 memory the core outputs are effectively ORed as they leave each module by the diode in the output line. In the S1 Memory patent the inputs were ORed at the sense amplifier itself. With the decrease in wiring, the number of inputs to the sense amplifier is reduced to two per bit which permits all necessary sense amplifiers to be put on the same card. This increases the system simplicity a great deal. Further the diode effectively decouples the core output multiple, permitting the core to be cleared down quickly by the resistor across each core sense winding. The cable from the diode to the sense amplifier is celared down by the terminating resistance of the sense amplifier input, This makes it feasible for the sense amplifier input to be differential as the core output is balanced with respect to ground and this offers greatly improved noise immunity.

Referring to FIG. 4 the differential outputs are shown connected to terminators and also the line receivers. In particular an AC termination is used at the end of the sense amplifier bus located in the data memory control (DMC). This provides the necessary termination for the signal and transients, but draws no current when the sense amplifiers are off. The actual line receiver in the circuit is a National TYpe DM8820 which responds to plurality reversal at its inputs while maintaining a common mode rejection of ±15 volts. The outputs of the line receiver are strobed into latches under control of the DMC.

A particular environment for the sense amplifier has been described, however the invention may also be used as a general purpose differential in/out line receiver and driver. In such an environment the input would not necessarily come from memory cores.

While principles of the invention have been illustrated above in connection with specific apparatus and applications, it is to be understood that this description is made only by way of example and not as a limitation on the scope of the invention as encompassed by the following claims.

What I claim is:

1. A sense amplifier comprising:
balanced differential input means having an output;
threshold circuit means coupled to the output of said differential input means having an output, said threshold circuit means comprising
an AC coupling capacitor,
false trigger prevention means,
first amplifying transistor means and second output transistor means, whereby the output of said balanced differential input means is coupled to the base of said first amplifying transistor means though said AC coupling capacitor and the output of said first amplifying transistor means is coupled to the base of said second output transistor means and the ouput of said second output transistor means is a single output at a specified voltage, and said false trigger prevention means is coupled to said first amplifying transistor means; and complementary output means coupled to the output of said threshold circuit means.

2. A sense amplifier comprising;

balanced differential input means having an output;

threshold circuit means coupled to the output of said differential input means having an output; and complementary output means coupled to the output of said threshold circuit means and comprising phase splitting transistor means;

two complementary output transistor means; and short circuit protection means comprising resistor means in the emitter circuits of each of said complementary output transistor means;

whereby the output of said threshold circuit means is coupled to the base of said phase splitting transistor means and the output of said phase splitting transistor means is two outputs, one coupled to each complementary output transistor means, and the output of each complementary output transistor means are the sense amplifier outputs.

3. A sense amplifier comprising:

having an output comprising;

first and second signal input means;

first and second impedance means;

first and second transistor means; and current source means;

whereby said first and second signal input means are coupled through said first and second impedance means respectively to the base of said first and second transistor means respectively, and said current source means is coupled to the emitters of said first and second transistor means and the output of said balanced differential input means comprises a single output from said second transistor means;

threshold circuit means coupled to the output of said differential input means comprising;

an AC coupling capacitor;

false trigger prevention means;

first amplifying transistor means; and second output transistor means;

whereby the output of said balanced differential input means is coupled to the base of said amplifying transistor means through said AC coupling capacitor and the output of said first amplifying transistor means is coupled to the base of said second output transistor means and the output of said second output transistor means is a single output at a specified voltage, and said false trigger prevention means is coupled to said first amplifying transistor means; and complementary output means coupled to the output of said threshold circuit means and comprising;

phase splitting transistor means;

two complementary output transistor means; and short circuit protection means comprising resistor means in the emitter circuits of each of said complementary output transistor means;

whereby the output of said threshold circuit means is coupled to the base of said phase splitting transistor means and the output of said phase splitting transistor means is two outputs, one coupled to each complementary output transistor means and the output of each complementary output transistor means is the sense amplifier output.

4. An improved sense amplifier for a memory and line receiver arrangement, said memory arrangement comprising a plurality of ring shaped magnetic cores with an individual sense winding on each core, word wires selectively threaded through the inside of some of said cores and outside of others to thereby store information, and memory input means to select one of said word wires and supply a current pulse thereto, to thereby generate an output pulse in the sense windings of each core having the selected wire threaded through it, each output pulse is coupled to said improved sense amplifier on balanced sense output lines, said improved sense amplifier comprising:

balanced differential input means having an output coupled to said balanced sense output lines and comprising;

first and second signal input means;

first and second impedance means;

first and second transistor means; and current source means;

whereby said first and second signal input means are coupled through said first and second impedance means respectively to the base of said first and second transistor means respectively, and said current source means is coupled to the emitters of said first and second transistor means, and the output of said balanced differential input means comprises a single output from said second transistor means;

threshold circuit means coupled to the output of said differential input means and comprising;

an AC coupling capacitor;

false trigger prevention means;

first amplifying transistor means; and second output transistor means;

whereby the output of said balanced differential input means is coupled to the base of said first amplifying transistor means through said AC coupling capacitor and the output of said first amplifying transistor means is coupled to the base of said second output transistor means is a single output at a specified voltage, and said false trigger prevention means is coupled to said first amplyifying transistor means; and complementary output means coupled to the output of said threshold circuit means and said line receiver arrangement and comprising;

phase splitting transistor means;

two complementary output transistor means; and short circuit protection means comprising resistor means in the emitter circuits of each of said complementary output transistor means;

whereby the output of said threshold circuit means is coupled to the base of said phase splitting transistor means and the output of said phase splitting transistor means is two outputs, one coupled to each complementary output transistor means is the sense amplifier output to said line receiver arrangement.

* * * * *